United States Patent
Jeon et al.

(10) Patent No.: US 10,534,261 B2
(45) Date of Patent: Jan. 14, 2020

(54) COLORED PHOTOSENSITIVE RESIN COMPOSITION AND LIGHT SHIELDING SPACER PREPARED THEREFROM

(71) Applicant: Rohm and Haas Electronic Materials Korea Ltd., Cheonan (KR)

(72) Inventors: Hyung-Tak Jeon, Hwaseong (KR); Ji Ung Kim, Hwaseong (KR); Kyung-Jae Park, Hwaseong (KR); Jong-Ho Na, Hwaseong (KR); Hyung Gu Kim, Seo-gu (KR); Seok-Bong Park, Yongin (KR)

(73) Assignee: Rohm and Haas Electronic Materials Korea Ltd., Seoul (KR)

( * ) Notice: Subject to any disclaimer, the term of this patent is extended or adjusted under 35 U.S.C. 154(b) by 294 days.

(21) Appl. No.: 15/782,171

(22) Filed: Oct. 12, 2017

(65) Prior Publication Data
US 2018/0120699 A1    May 3, 2018

(30) Foreign Application Priority Data

Oct. 31, 2016 (KR) .......... 10-2016-0143604
Jun. 12, 2017 (KR) .......... 10-2017-0073371

(51) Int. Cl.
| G03F 7/038 | (2006.01) |
| G02F 1/1339 | (2006.01) |
| G03F 7/032 | (2006.01) |
| G03F 7/105 | (2006.01) |
| G02F 1/1335 | (2006.01) |
| G03F 7/031 | (2006.01) |
| G03F 7/16 | (2006.01) |
| G03F 7/20 | (2006.01) |
| G03F 7/32 | (2006.01) |
| G03F 7/40 | (2006.01) |

(52) U.S. Cl.
CPC .......... *G03F 7/032* (2013.01); *G02F 1/13394* (2013.01); *G02F 1/133512* (2013.01); *G03F 7/031* (2013.01); *G03F 7/038* (2013.01); *G03F 7/0388* (2013.01); *G03F 7/105* (2013.01); *G03F 7/162* (2013.01); *G03F 7/168* (2013.01); *G03F 7/2002* (2013.01); *G03F 7/322* (2013.01); *G03F 7/40* (2013.01)

(58) Field of Classification Search
CPC ........ G03F 7/0007; G03F 7/105; G03F 7/031; G03F 7/032; G03F 7/0385; G03F 7/0388; G03F 7/038; G02F 1/133512; G02F 1/113394
USPC .... 430/7, 280.1, 281.1, 287.1; 349/110, 156
See application file for complete search history.

(56) References Cited

U.S. PATENT DOCUMENTS

2015/0060745 A1* 3/2015 Liao .................. G02B 1/04
                                                    252/586

FOREIGN PATENT DOCUMENTS

| JP | 2001-154206 | * | 6/2001 |
| KR | 1020080043704 A | | 5/2008 |
| KR | 1020130021128 A | | 3/2013 |
| KR | 101291480 B1 | | 7/2013 |
| KR | 1020140103372 A | | 8/2014 |
| KR | 2014-0147062 | * | 12/2014 |
| KR | 1020150055417 A | | 5/2015 |
| KR | 1020150134989 A | | 12/2015 |
| KR | 1020160057877 A | | 5/2016 |
| KR | 101658374 B1 | | 9/2016 |
| KR | 1020160118666 A | | 10/2016 |

OTHER PUBLICATIONS

Computer-generated translation of JP 2001-154206 (Jun. 2001). (Year: 2001).*
Computer-generated translation of KR 2014-0147062 (Dec. 2014). (Year: 2014).*

* cited by examiner

*Primary Examiner* — John A McPherson
(74) *Attorney, Agent, or Firm* — S. Matthew Cairns

(57) ABSTRACT

The present invention relates to a colored photosensitive resin composition capable of forming a cured film that does not generate uneven wrinkles on its surface at the time of its formation, and a light shielding spacer produced therefrom and used for a liquid crystal display, an organic EL display, or the like.

9 Claims, 3 Drawing Sheets

[Fig. 1]
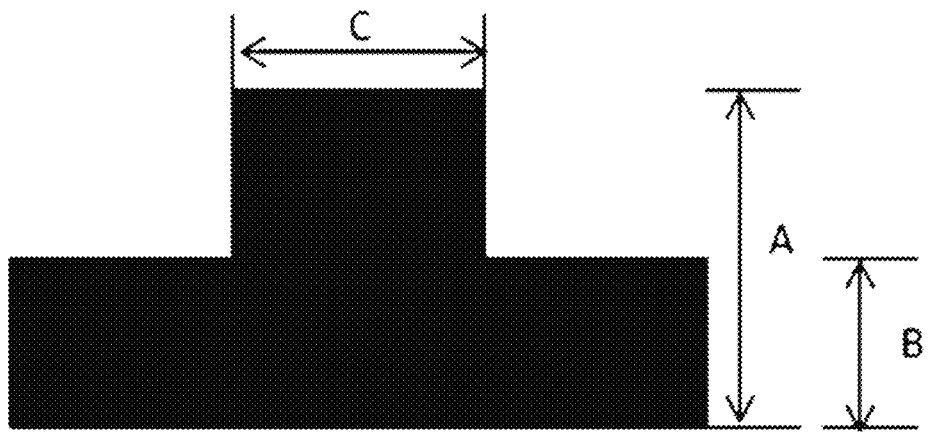
[Fig. 2]
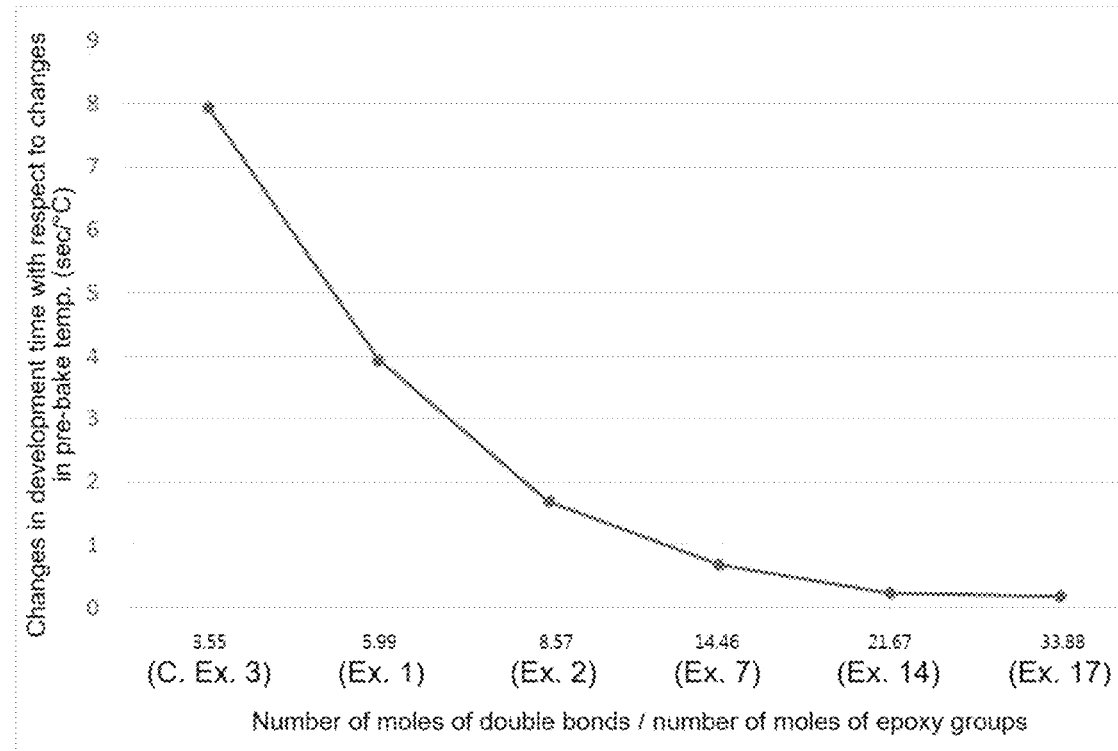

[Fig. 3]
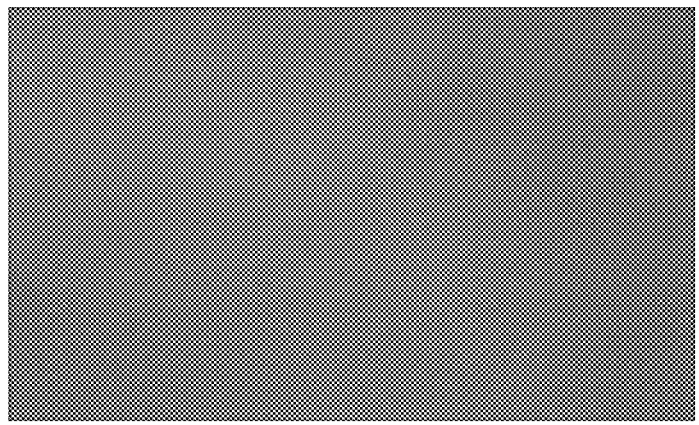
[Fig. 4]
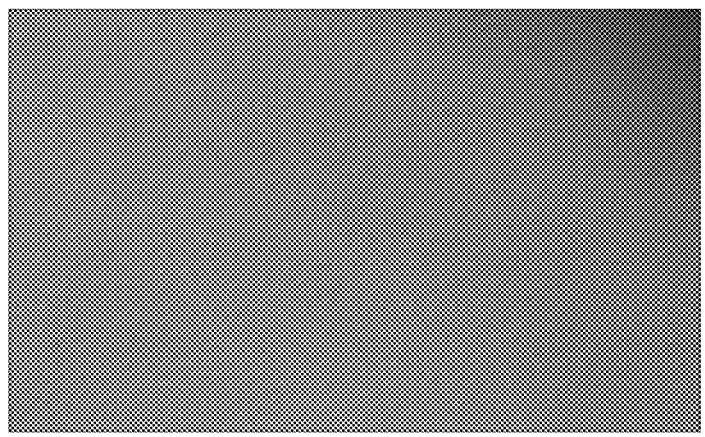
[Fig. 5]
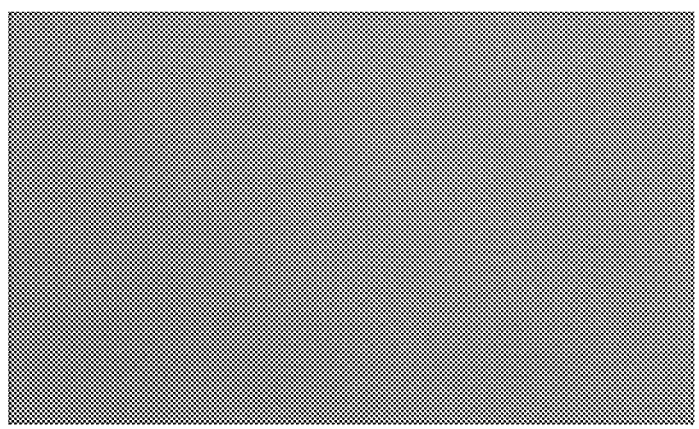

[Fig. 6]
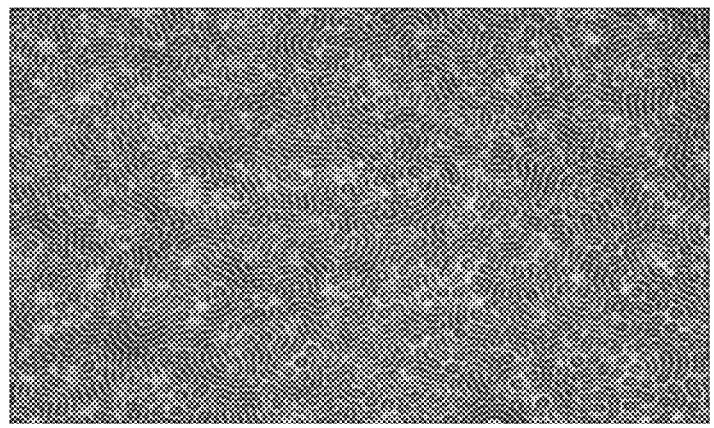
[Fig. 7]
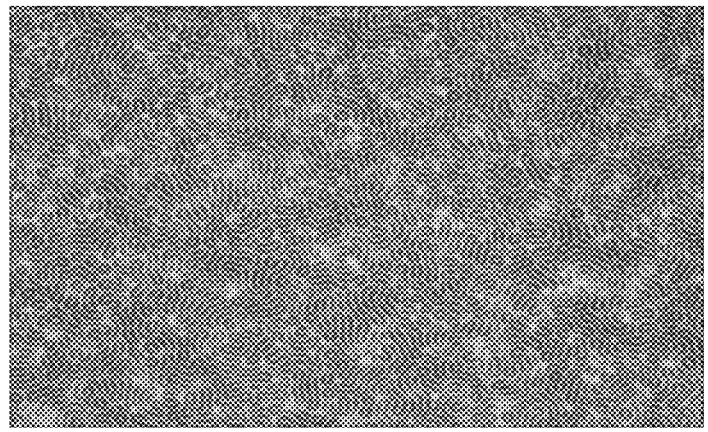

COLORED PHOTOSENSITIVE RESIN COMPOSITION AND LIGHT SHIELDING SPACER PREPARED THEREFROM

TECHNICAL FIELD

The present invention relates to a colored photosensitive resin composition capable of forming a cured film that does not generate uneven wrinkles on its surface at the time of its formation, and a light shielding spacer produced therefrom and used for a liquid crystal display, an organic EL display, or the like.

BACKGROUND ART

Recently, a spacer prepared from a photosensitive resin composition is employed in order to maintain a constant distance between the upper and lower transparent substrates in liquid crystal cells of a liquid crystal display (LCD). In an LCD, which is an electro-optical device driven by a voltage applied to a liquid crystal material injected into a constant gap between two transparent substrates, it is very critical to maintain the gap between the two substrates to be constant. If the gap between the transparent substrates is not constant, the voltage applied thereto as well as the transmittance of light penetrating this area may vary, resulting in a defect of spatially non-uniform luminance. According to a recent demand for large LCD panels, it is even more critical to maintain a constant gap between two transparent substrates in an LCD.

Such a spacer may be prepared by coating a photosensitive resin composition onto a substrate and exposing the coated substrate to ultraviolet light, etc., using a mask, followed by development thereof. Recently, efforts of using a light shielding material for a spacer have been made; accordingly, various colored photosensitive resin compositions have been actively developed.

Recently, a black column spacer (BCS) in which a column spacer and a black matrix are integrated into a single module using a colored photosensitive resin composition has been aimed to simplify the process steps. The colored photosensitive resin composition used in the production of such a black column spacer is required not only to easily form a step difference but also to satisfy sensitivity and development margin characteristics at the same time. Especially, if a cured film formed from a colored photosensitive resin composition has uneven wrinkles on its surface, it may cause a serious disadvantage that the amount of injected liquid crystals may not be uniform due to a defect in the gap between the upper and lower plates during their assembly or that spots may be generated on the display due to a poor transmission of electric signals.

In order to suppress the generation of wrinkles on the surface of a cured film, therefore, a photosensitive resin composition comprising an acrylic resin as a wrinkle generation inhibitor has been proposed (Korean Patent No. 1291480). In Korean Patent No. 1291480, however, since the acrylic resin thus employed comprises (meth)acrylic acid units in a large amount of 60 to 85 mole %, it is difficult to form a step difference of a pattern for forming a light shielding spacer due to such a high acid value of the acrylic binder.

DISCLOSURE OF INVENTION

Technical Problem

Accordingly, an object of the present invention is to provide a colored photosensitive resin composition capable of forming a cured film that does not generate uneven wrinkles on its surface at the time of its formation and a light shielding spacer produced therefrom.

Solution to Problem

In order to accomplish the above object, the present invention provides a colored photosensitive resin composition, which comprises:
(A) a copolymer comprising an epoxy group;
(B) a photopolymerizable compound comprising a double bond;
(C) a photopolymerization initiator; and
(D) a colorant,
wherein the molar ratio of the double bonds in the photopolymerizable compound (B) to the epoxy groups in the copolymer (A) satisfies the following relationship:

4≤number of moles of double bonds/number of moles of epoxy groups≤35; and wherein a cured film formed from the colored photosensitive resin composition has an optical density of 1.0/μm to 3.0/μm.

Further, the present invention provides a light shielding spacer produced by curing the colored photosensitive resin composition.

Advantageous Effects of Invention

The colored photosensitive resin composition of the present invention can form a cured film devoid of uneven wrinkles on its surface, to thereby minimize spots that may be generated on the display due to a defect in the gap between the upper and lower plates during their assembly and provide a high process yield by virtue of stable manufacture of products despite variations in the conditions of the manufacturing process.

BRIEF DESCRIPTION OF THE DRAWINGS

FIG. 1 is a schematic diagram of an embodiment of the cross-section of a light shielding spacer (black column spacer).

FIG. 2 is a graph showing changes in the development time with respect to the ratio of the number of moles of double bonds to the number of moles of epoxy groups measured in the Examples.

FIG. 3 is a photograph of the surface of a cured film prepared from the photosensitive resin composition of Example 2.

FIG. 4 is a photograph of the surface of a cured film prepared from the photosensitive resin composition of Example 13.

FIGS. 5 to 7 are respective photographs of the surfaces of cured films prepared from the photosensitive resin compositions of Comparative Examples 3 to 5.

BEST MODE FOR CARRYING OUT THE INVENTION

The colored photosensitive resin composition of the present invention comprises: (A) a copolymer comprising an epoxy group; (B) a photopolymerizable compound comprising a double bond; (C) a photopolymerization initiator; and (D) a colorant, wherein the molar ratio of the double bonds in the photopolymerizable compound (B) to the epoxy groups in the copolymer (A) satisfies the following relationship:

4≤number of moles of double bonds/number of moles of epoxy groups≤35; and wherein a cured film formed from the colored photosensitive resin composition has an optical density of 1.0/μm to 3.0/μm.

In the present disclosure, "(meth)acryl" means "acryl" and/or "methacryl", and "(meth)acrylate" means "acrylate" and/or "methacrylate."

Hereinafter, each component of the colored photosensitive resin composition will be explained in detail.

(A) Copolymer Comprising an Epoxy Group

The copolymer used in the present invention may comprise (a-1) a structural unit derived from an ethylenically unsaturated carboxylic acid, an ethylenically unsaturated carboxylic anhydride, or a combination thereof, (a-2) a structural unit derived from an ethylenically unsaturated compound containing an aromatic ring, and (a-3) a structural unit derived from an ethylenically unsaturated compound containing an epoxy group, and may further comprise (a-4) a structural unit derived from an ethylenically unsaturated compound different from (a-1), (a-2), and (a-3).

The copolymer is an alkali-soluble resin for having developability in the development step and may also play the role of a base for forming a film upon coating and a structure for forming a final pattern.

(a-1) Structural Unit Derived from an Ethylenically Unsaturated Carboxylic Acid, an Ethylenically Unsaturated Carboxylic Anhydride, or a Combination Thereof In the present invention, the structural unit (a-1) is derived from an ethylenically unsaturated carboxylic acid, an ethylenically unsaturated carboxylic anhydride, or a combination thereof. The ethylenically unsaturated carboxylic acid or the ethylenically unsaturated carboxylic anhydride is a polymerizable unsaturated monomer containing at least one carboxyl group in the molecule. Particular examples thereof may include an unsaturated monocarboxylic acid such as (meth)acrylic acid, crotonic acid, alpha-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid of trivalence or more and an anhydride thereof; and a mono[(meth)acryloyloxyalkyl] ester of a polycarboxylic acid of divalence or more such as mono[2-(meth)acryloyloxyethyl] succinate, mono[2-(meth)acryloyloxyethyl] phthalate, and the like. The structural unit derived from the above exemplified compounds may be comprised in the copolymer alone or in combination of two or more.

The amount of the structural unit (a-1) may be 5 to 65 mole %, or 10 to 50 mole %, based on the total moles of the structural units constituting the copolymer. Within this amount range, developability may be favorable.

(a-2) Structural Unit Derived from an Ethylenically Unsaturated Compound Containing an Aromatic Ring The structural unit (a-2) is derived from an ethylenically unsaturated compound containing an aromatic ring. Particular examples of the ethylenically unsaturated compound containing an aromatic ring may include phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth)acrylate; styrene; styrene containing an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; styrene containing halogen such as fluorostyrene, chlorostyrene, bromostyrene, and iodostyrene; styrene containing an alkoxy substituent such as methoxystyrene, ethoxystyrene, and propoxystyrene; 4-hydroxystyrene, p-hydroxy-α-methylstyrene, acetylstyrene; vinyltoluene, divinylbenzene, vinylphenol, o-vinylbenzyl methyl ether, m-vinylbenzyl methyl ether, p-vinylbenzyl methyl ether, o-vinylbenzyl glycidyl ether, m-vinylbenzyl glycidyl ether, p-vinylbenzyl glycidyl ether, and the like. The structural unit derived from the above exemplified compounds may be comprised in the copolymer alone or in combination of two or more. Among the above compounds, the styrene-based compounds may be preferably used in consideration of polymerizability.

The amount of the structural unit (a-2) may be 2 to 70 mole %, or 3 to 60 mole %, based on the total moles of the structural units constituting the copolymer. Within this amount range, chemical resistance may be more favorable.

(a-3) Structural Unit Derived from an Ethylenically Unsaturated Compound Containing an Epoxy Group The structural unit (a-3) is derived from an ethylenically unsaturated compound containing an epoxy group. Particular examples of the ethylenically unsaturated compound containing an epoxy group may include glycidyl (meth)acrylate, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, 4-hydroxybutyl (meth)acrylate glycidyl ether, 4-hydroxybutyl acrylate glycidyl ether, allyl glycidyl ether, 2-methylallyl glycidyl ether, and the like. The structural unit derived from the above exemplified compounds may be comprised in the copolymer alone or in combination of two or more. Among these, a structural unit derived from glycidyl (meth)acrylate and/or 4-hydroxybutyl (meth)acrylate glycidyl ether may be more preferable in view of copolymerizability and improvement in the strength of an insulating film.

The amount of the structural unit (a-3) may be 1 to 40 mole %, or 5 to 20 mole %, based on the total moles of the structural units constituting the copolymer. Within this amount range, residues during the process and margins at the time of pre-bake may be more favorable.

(a-4) Structural Unit Derived from an Ethylenically Unsaturated Compound Different From (a-1), (a-2), And (a-3)

The copolymer used in the present invention may further comprise a structural unit derived from an ethylenically unsaturated compound different from (a-1), (a-2), and (a-3) in addition to (a-1), (a-2), and (a-3).

Particular examples of the structural unit derived from an ethylenically unsaturated compound different from (a-1), (a-2), and (a-3) may include an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth) acrylate, 3-methoxybutyl (meth)acrylate, ethoxy diethylene glycol (meth)acrylate, methoxy triethylene glycol (meth) acrylate, methoxy tripropylene glycol (meth)acrylate, poly (ethylene glycol) methyl ether (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine containing an N-vinyl group such as N-vinyl pyrrolidone, N-vinyl carbazole, and N-vinyl morpholine; an unsaturated ether such as vinyl methyl ether and vinyl ethyl ether; an unsaturated imide such as N-phenylmaleimide, N-(4-chlorophenyl)maleimide, N-(4-hydroxyphenyl)maleimide, N-cyclohexylmaleimide, and the like. The structural unit derived from the above exemplified compounds may be comprised in the copolymer alone or in combination of two or more. Among these, a structural unit derived from an unsaturated imide, specifically N-substituted maleimide, may be more preferable in view of copolymerizability and improvement in the strength of an insulating film.

The amount of the structural unit (a-4) may be 0 to 80 mole %, or 10 to 75 mole %, based on the total moles of the structural units constituting the copolymer. Within this amount range, storage stability of a colored photosensitive resin composition may be maintained, and film retention rate may be more advantageously improved.

Examples of the copolymer having the structural units (a-1) to (a-4) may include a copolymer of (meth)acrylic acid/styrene/methyl (meth)acrylate/glycidyl (meth)acrylate, a copolymer of (meth)acrylic acid/styrene/methyl (meth) acrylate/glycidyl (meth)acrylate/N-phenylmaleimide, a copolymer of (meth)acrylic acid/styrene/methyl (meth)acrylate/glycidyl (meth)acrylate/N-cyclohexylmaleimide, a copolymer of (meth)acrylic acid/styrene/n-butyl (meth) acrylate/glycidyl (meth)acrylate/N-phenylmaleimide, a copolymer of (meth)acrylic acid/styrene/glycidyl (meth) acrylate/N-phenylmaleimide, a copolymer of (meth)acrylic acid/styrene/4-hydroxybutyl (meth)acrylate glycidyl ether/ N-phenylmaleimide, and the like.

One, two, or more of the copolymers may be comprised in the colored photosensitive resin composition.

The weight average molecular weight (Mw) of the copolymer may be in the range of 5,000 to 30,000, or 10,000 to 20,000, when determined by gel permeation chromatography (eluent: tetrahydrofuran) referenced to polystyrene. Within this range, adhesiveness to a substrate, physical/chemical properties, and viscosity may be more favorable.

The copolymer may be employed in an amount of 5 to 60 wt %, or 8 to 45 wt %, based on the total weight of the solid content (i.e., the weight excluding solvents) of the colored photosensitive resin composition. Within this range, a pattern profile after development may be favorable, and such properties as film retention rate and chemical resistance may be improved.

The copolymer may be prepared by charging to a reactor a radical polymerization initiator, a solvent, and the structural units (a-1) to (a-4), as well as nitrogen thereto, followed by slowly stirring the mixture for polymerization.

The radical polymerization initiator may be an azo compound such as 2,2'-azobisisobutyronitrile, 2,2'-azobis(2,4-dimethylvaleronitrile), and 2,2'-azobis(4-methoxy-2,4-dimethylvaleronitrile); or benzoyl peroxide, lauryl peroxide, t-butyl peroxypivalate, 1,1-bis(t-butylperoxy)cyclohexane, or the like, but is not limited thereto. The radical polymerization initiator may be used alone or in combination of two or more.

The solvent may be any conventional solvent commonly used in the preparation of a copolymer and may include, for example, propylene glycol monomethyl ether acetate (PG-MEA).

(B) Photopolymerizable Compound Comprising a Double Bond

The photopolymerizable compound used in the present invention may be any compound that has a double bond and may be polymerized by the action of a polymerization initiator. Specifically, the photopolymerizable compound may include a monofunctional or polyfunctional ester compound having at least one ethylenically unsaturated double bond and may preferably include a polyfunctional compound having at least two functional groups from the view point of chemical resistance.

The photopolymerizable compound may be selected from the group consisting of ethylene glycol di(meth)acrylate, propylene glycol di(meth)acrylate, diethylene glycol di(meth)acrylate, triethylene glycol di(meth)acrylate, 1,6-hexanediol di(meth)acrylate, polyethylene glycol di(meth)acrylate, polypropylene glycol di(meth)acrylate, glycerin tri(meth) acrylate, trimethylolpropane tri(meth)acrylate, pentaerythritol tri(meth)acrylate, a monoester of pentaerythritol tri (meth)acrylate and succinic acid, pentaerythritol tetra(meth) acrylate, dipentaerythritol penta(meth)acrylate, dipentaerythritol hexa(meth)acrylate, a monoester of dipentaerythritol penta(meth)acrylate and succinic acid, pentaerythritol triacrylate-hexamethylene diisocyanate (a reaction product of pentaerythritol triacrylate and hexamethylene diisocyanate), tripentaerythritol hepta(meth) acrylate, tripentaerythritol octa(meth)acrylate, bisphenol A epoxyacrylate, and ethylene glycol monomethyl ether acrylate, and a mixture thereof, but is not limited thereto.

Examples of a commercially available photopolymerizable compound may include (i) monofunctional (meth) acrylate such as Aronix M-101, M-111, and M-114 manufactured by Toagosei Co., Ltd., KAYARAD T4-110S, and T4-120S manufactured by Nippon Kayaku Co., Ltd., and V-158, and V-2311 manufactured by Osaka Yuki Kayaku Kogyo Co., Ltd.; (ii) bifunctional (meth)acrylate such as Aronix M-210, M-240, and M-6200 manufactured by Toagosei Co., Ltd., KAYARAD HDDA, HX-220, and R-604 manufactured by Nippon Kayaku Co., Ltd., and V-260, V-312, and V-335 HP manufactured by Osaka Yuki Kayaku Kogyo Co., Ltd.; and (iii) tri- and more functional (meth) acrylate such as Aronix M-309, M-400, M-403, M-405, M-450, M-7100, M-8030, M-8060, and TO-1382 manufactured by Toagosei Co., Ltd., KAYARAD TMPTA, DPHA, and DPHA-40H manufactured by Nippon Kayaku Co., Ltd., and V-295, V-300, V-360, V-GPT, V-3PA, V-400, and V-802 manufactured by Osaka Yuki Kayaku Kogyo Co., Ltd.

The amount of the photopolymerizable compound may be 10 to 50 wt %, 15 to 40 wt %, or 20 to 30 wt %, based on the total weight of the solid content (i.e., the weight excluding solvents) of the colored photosensitive resin composition. Within this range, a pattern may be readily developed, and such properties as chemical resistance and elastic restoring force may be improved.

The molar ratio of the double bonds in the photopolymerizable compound (B) to the epoxy groups in the copolymer (A) satisfies the following relationship:

4≤number of moles of double bonds/number of moles of epoxy groups≤35.

Specifically, the molar ratio of the double bonds in the photopolymerizable compound (B) to the epoxy groups in the copolymer (A) satisfies the following relationship:

11≤number of moles of double bonds/number of moles of epoxy groups≤35.

If a cured film for display bezels has uneven wrinkles on its surface, it may cause a serious disadvantage that the amount of injected liquid crystals may not be uniform due to a defect in the gap between the upper and lower plates during their assembly or that spots may be generated on the display due to a poor transmission of electric signals. Within the above range, when a cured film is formed from the colored photosensitive resin composition of the present invention, the generation of uneven wrinkles on the surface of the cured film is minimized, and it is possible to easily form a step difference and to form a pattern in a high resolution.

If the molar ratio exceeds 35, the curing of the surface of a coated film during exposure to light is strongly taken place, while materials having unreacted double bonds remain in its interior, which raises the flowability (i.e., mobility) of such unreacted materials in the subsequent thermal curing step. As a result, the polymer near the surface and the polymer inside the pattern would have different mobilities during thermal curing, resulting in uneven wrinkles on the surface of the cured film. Further, if the molar ratio is less than 4, it is difficult to control the degree of crosslinking in accordance with changes in temperature since the number of moles of epoxy groups is relatively higher than the number of moles of double bonds, which makes poor the development margins in accordance with temperature changes during the process and lowers the resolution.

(C) Photopolymerization Initiator

The photopolymerization initiator used in the present invention may be any known polymerization initiator.

The photopolymerization initiator may be selected from the group consisting of an acetophenone compound, a nonimidazole compound, a triazine compound, an onium salt compound, a benzoin compound, a benzophenone compound, a polynuclear quinone compound, a thioxanthone compound, a diazo compound, an imidesulfonate compound, an oxime compound, a carbazole compound, a sulfonium borate compound, a ketone compound, and a mixture thereof. Specifically, the photopolymerization initiator may be at least one selected from the group consisting of an oxime compound, a triazine compound, and a ketone compound. A combination of an oxime compound, a triazine compound, and a ketone compound may also be used.

Particular examples of the photopolymerization initiator may include 2,2'-azobis(2,4-dimethylvaleronitrile), 2,2'-azobis(4-methoxy-2,4-dimethylvaleronitrile), benzoyl peroxide, lauryl peroxide, t-butyl peroxy pivalate, 1,1-bis(t-butylperoxy)cyclohexane, p-dimethylaminoacetophenone, 2-benzyl-2-(dimethylamino)-1-[4-(4-morpholinyl)phenyl]-1-butanone, 2-hydroxy-2-methyl-1-phenyl-propan-1-one, benzyl dimethyl ketal, benzophenone, benzoin propyl ether, diethyl thioxanthone, 2,4-bis (trichloromethyl)-6-p-methoxyphenyl-s-triazine, 2-trichloromethyl-5-styryl-1,3,4-oxodiazole, 9-phenylacridine, 3-methyl-5-amino-((s-triazin-2-yl)amino)-3-phenylcoumarin, 2-(o-chlorophenyl)-4,5-diphenylimidazolyl dimer, 1-phenyl-1,2-propanedione-2-(o-ethoxycarbonyl)oxime, 1-[4-(phenylthio)phenyl]-octane-1, 2-dione-2-(o-benzoyloxime), o-benzoyl-4'-(benzmercapto) benzoyl-hexyl-ketoxime, 2,4,6-trimethylphenylcarbonyl-diphenylphosphonyloxide, hexafluorophosphoro-trialkylphenylsulfonium salts, 2-mercaptobenzimidazole, 2,2'-benzothiazolyl disulfide, (E)-2-(4-styrylphenyl)-4,6-bis (trichloromethyl)-1,3,5-triazine, 2-dimethylamino-2-(4-methylbenzyl)-1-(4-morpholin-4-ylphenyl)-butanone, and a mixture thereof, but is not limited thereto.

Examples of commercially available oxime-based photopolymerization initiators include OXE-01 (BASF), OXE-02 (BASF), OXE-03 (BASF), N-1919 (ADEKA), NCI-930 (ADEKA), and NCI-831 (ADEKA).

The photopolymerization initiator may be used in an amount of 0.1 to 15 wt %, or 0.1 to 10 wt %, based on the total weight of the solid content (i.e., the weight excluding solvents) of the colored photosensitive resin composition. Specifically, for example, 0.1 to 2 wt % of an oxime compound, 0.1 to 2 wt % of a triazine compound, and 0.1 to 2 wt % of a ketone compound, based on the total weight of the solid content (i.e., the weight excluding solvents) of the colored photosensitive resin composition, may be used as the photopolymerization initiator. More specifically, 0.5 to 1.5 wt % of an oxime compound, 0.5 to 1.5 wt % of a triazine compound, and 0.5 to 1.5 wt % of a ketone compound, based on the total weight of the solid content (i.e., the weight excluding solvents) of the colored photosensitive resin composition, may be used as the photopolymerization initiator.

Within this range of an oxime compound, development and coating properties may be improved with high sensitivity. Within this range of an triazine compound, a coated film with excellent chemical resistance and taper angles upon formation of a pattern may be obtained. Furthermore, within this range of a ketone compound, a colored photosensitive resin composition thus prepared can form a coated film with excellent chemical resistance through curing of the inside part of the coated film.

(D) Colorant

The colored photosensitive resin composition of the present invention comprises a colorant to impart the light shielding property thereto. The colorant used in the present invention may be a mixture of two or more inorganic or organic colorants. It preferably has high chromogenicity and high heat resistance.

The colorant may be at least one selected from the group consisting of a black organic colorant, black inorganic colorant, and a colorant other than a black colorant.

Any black inorganic colorant, any black organic colorant, and any colorant other than a black colorant known in the art may be used. For example, compounds classified as a pigment in the Color Index (published by The Society of Dyers and Colourists) and any dyes known in the art may be used.

Particular examples of the black inorganic colorant may include carbon black, titanium black, a metal oxide such as Cu—Fe—Mn-based oxide and synthetic iron black, and the like. Preferred among them is carbon black for desirable pattern properties and chemical resistance.

Particular examples of the black organic colorant may include aniline black, lactam black, perylene black, and the like. Preferred among them is lactam black (e.g., Black 582 from BASF) for desirable optical density, dielectricity, and the like.

Particular examples of the colorant other than a black colorant may include C.I. Pigment Yellow 20, 24, 31, 53, 83, 86, 93, 94, 109, 110, 117, 125, 137, 138, 139, 147, 148, 150, 153, 154, 166, 173, 180, and 185; C.I. Pigment Orange 13, 31, 36, 38, 40, 42, 43, 51, 55, 59, 61, 64, 65, and 71; C.I. Pigment Red 9, 97, 105, 122, 123, 144, 149, 166, 168, 176, 177, 179, 180, 192, 215, 216, 224, 242, 254, 255, and 264; C.I. Pigment Violet 14, 19, 23, 29, 32, 33, 36, 37, and 38;

C.I. Pigment Blue 15 (15:3, 15:4, 15:6, etc.), 16, 21, 28, 60, 64, and 76; C.I. Pigment Green 7, 10, 15, 25, 36, 47, and 58; C.I. Pigment Brown 28, and the like. Preferred among them is C.I. Pigment Blue 15:6 for preventing light leakage.

The amount of the colorant may be 10 to 60 wt %, or 20 to 50 wt %, based on the total weight of the solid content (i.e., the weight excluding solvents) of the colored photosensitive resin composition. Within this range, a pattern profile after development may be favorable, and such properties as chemical resistance and elastic restoring force may be improved.

Meanwhile, the colorant used in the present invention may be added to the colored photosensitive resin composition in the form of a mill base as mixed with a dispersion resin, a solvent, or the like.

The dispersion resin serves to uniformly disperse a pigment in a solvent and may be specifically at least one selected from the group consisting of a dispersant and a dispersion binder.

Examples of the dispersant may include any known dispersant for a colorant. Particular examples thereof include a cationic surfactant, an anionic surfactant, a nonionic surfactant, a zwitterionic surfactant, a silicon surfactant, a fluorine surfactant, a polyester compound, a polycarboxylic acid ester compound, an unsaturated polyamide compound, a polycarboxylic acid compound, a polycarboxylic acid alkyl salt compound, a polyacrylic compound, a polyethyleneimine compound, a polyurethane compound, polyurethane, a polycarboxylic acid ester represented by polyacrylate, unsaturated polyamide, polycarboxylic acid, an amine salt of polycarboxylic acids, an ammonium salt of polycarboxylic acid, an alkylamine salt of polycarboxylic acids, polysiloxane, a long chain polyaminoamide phosphate salt, an ester of polycarboxylic acid whose hydroxyl group is substituted and its modified product, an amide formed by reaction of polyester having a free carboxyl group with a poly(lower alkyleneimine) or a salt thereof, (meth) acrylic acid-styrene copolymer, (meth)acrylic acid-(meth) acrylate ester copolymer, styrene-maleic acid copolymer, polyvinyl alcohol, a water-soluble resin or a water-soluble polymer compound such as polyvinylpyrrolidone, modified polyacrylate, an adduct of ethylene oxide/propylene oxide, a phosphate ester, and the like. Commercially available dispersants may include Disperbyk-182, -183, -184, -185, -2000, -2150, -2155, -2163, or -2164 from BYK Co. These compounds may be used alone or in combination of two or more. The dispersant may have an amine group and/or an acid group as a pigment-affinity group and may optionally be of an ammonium salt type.

The dispersant may be added in advance to a colorant through surface treatment of the colorant therewith or added together with a colorant at the time of preparing a colored photosensitive resin composition.

The amine value of the dispersant may be 10 to 200 mg KOH/g, 40 to 200 mg KOH/g, or 50 to 150 mg KOH/g. When the amine value of the dispersant is within the above range, dispersibility and storage stability of the colorant are excellent, and roughness of the surface of a cured film formed from the resin composition is improved.

The dispersant may be in an amount of 1 to 20 wt %, or 2 to 15 wt %, based on the total weight of the colored dispersion. If the content of the dispersant is within the above range, the colorant is effectively dispersed to improve the dispersion stability, and the optical, physical, and chemical properties are improved by virtue of maintaining an appropriate viscosity when it is applied. Thus, it is desirable in terms of excellent balance between dispersion stability and viscosity.

Further, the colorant comprises a dispersion resin, and the dispersion resin has an amine value of 5 mg KOH/g or less and may comprise 30 mole % or less of a maleimide monomer based on the total number of moles of the constituents. At this time, the dispersion resin may be a dispersion binder.

If the dispersion binder has an acid value, it may contain a monomer having a carboxyl group and an unsaturated bond. Particular examples of the monomer having a carboxyl group and an unsaturated bond include a monocarboxylic acid such as acrylic acid, methacrylic acid, and crotonic acid; a dicarboxylic acid such as fumaric acid, mesaconic acid, and itaconic acid, and an anhydride of the dicarboxylic acid; a mono(meth)acrylate of a polymer having a carboxyl group and a hydroxyl group at both terminals such as ω-carboxypolycaprolactonemono(meth)acrylates, and the like. Preferred are acrylic acid and methacrylic acid.

Further, the dispersion binder may comprise a monomer having an unsaturated bond copolymerizable with the monomer having a carboxyl group and an unsaturated bond. Examples of the monomer having a copolymerizable unsaturated bond may, for example, include an aromatic vinyl compound such as styrene, vinyltoluene, α-methylstyrene, p-chlorostyrene, o-methoxystyrene, m-methoxystyrene, p-methoxy styrene, o-vinylbenzyl methyl ether, m-vinylbenzyl methyl ether, p-vinylbenzyl methyl ether, o-vinyl benzyl glycidyl ether, m-vinyl benzyl glycidyl ether, and p-vinylbenzyl glycidyl ether; an alkyl (meth)acrylate such as methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, and t-butyl (meth)acrylate; an alicyclic (meth)acrylates such as cyclopentyl (meth)acrylate, cyclohexyl (meth)acrylate, 2-methylcyclohexyl (meth)acrylate, tricyclo[5.2.1.0 2,6]decan-8-yl (meth)acrylate, 2-dicyclopentanyloxyethyl (meth) acrylate, and isobornyl (meth)acrylate; an aryl (meth)acrylate such as phenyl (meth)acrylate and benzyl (meth) acrylate; a hydroxyalkyl (meth)acrylate such as 2-hydroxyethyl (meth)acrylate and 2-hydroxypropyl (meth) acrylate; an N-substituted maleimide compound such as N-cyclohexylmaleimide, N-benzylmaleimide, N-phenylmaleimide, N-o-hydroxyphenylmaleimide, N-m-hydroxyphenylmaleimide, N-p-hydroxyphenylmaleimide, N-o-methylphenyl maleimide, N-m-methylphenylmaleimide, N-p-methylphenylmaleimide, N-o-methoxyphenylmaleimide, N-m-methoxyphenylmaleimide, and N-p-methoxyphenylmaleimide; an unsaturated amide compound such as (meth) acrylamide and N,N-dimethyl (meth)acrylamide; and an unsaturated oxetane compound such as 3-(methacryloyloxymethyl)oxetane, 3-(methacryloyloxymethyl)-3-ethyloxetane, 3-(methacryloyloxymethyl)-2-trifluoromethyloxetane, 3-(methacryloyloxymethyl)-2-phenyloxetane, 2-(methacryloyloxymethyl)oxetane, and 2-(methacryloyloxymethyl)-4-trifluoromethyloxetane, which may be used alone or in combination of two or more.

The dispersion binder may comprise 30 mole % or less of a maleimide monomer based on the total number of moles of the constituents.

The dispersion binder may have an acid value of 30 to 200 mg KOH/g. Specifically, the dispersion binder may have an acid value of 50 to 150 mg KOH/g. When the acid value of the dispersion binder is within the above range, the impact on the amine value of the dispersing agent encircling the pigment is reduced, thereby producing the effects of excellent stability of the colored dispersion and uniform particle size.

Further, if the amine value of the dispersion binder is more than 3 mg KOH/g, the stability of the dispersant encircling the pigment may be adversely affected, which may in turn adversely affect the storage stability of the entire resin composition. Thus, the amine value of the dispersion binder is preferably 3 mg KOH/g or less. If the amine value of the dispersion binder is within the above range, the unexposed portion can be readily developed in the development step, and such problems as residues generation can be improved.

The dispersion binder may be in an amount of 1 to 20 wt %, or 2 to 15 wt %, based on the total weight of the colored dispersion. If the dispersion binder is comprised in the above amount range, the resin composition can maintain an appropriate viscosity level, and it is preferable in terms of dispersion stability and developability.

The colored dispersion may be in an amount of 10 to 80 wt %, or 20 to 60 wt %, based on the total weight of the solid content of the colored photosensitive resin composition of the present invention.

(E) Compound Derived from an Epoxy Resin and Having a Double Bone

The colored photosensitive resin composition of the present invention may further comprise a compound derived from an epoxy resin and having a double bond. The compound derived from an epoxy resin has at least one double bond, may have a cardo backbone structure, may be a novolak-based resin, or may be an acrylic acid resin containing a double bond in its side chain.

The weight average molecular weight (Mw) of the compound derived from an epoxy resin may be in the range of 3,000 to 18,000, or 5,000 to 10,000, when determined by gel permeation chromatography referenced to polystyrene. Within this range, the step difference by a lower pattern may be advantageously improved, and a pattern profile after development may be favorable.

Specifically, the epoxy resin may be a compound having a cardo backbone structure as represented by Formula 1 below.

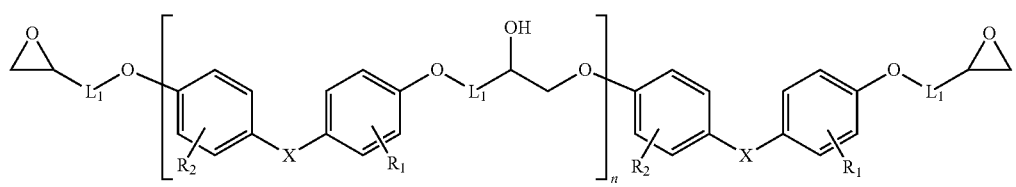

[Formula 1]

In Formula 1 above, X is each independently

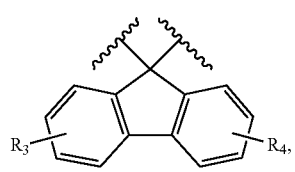

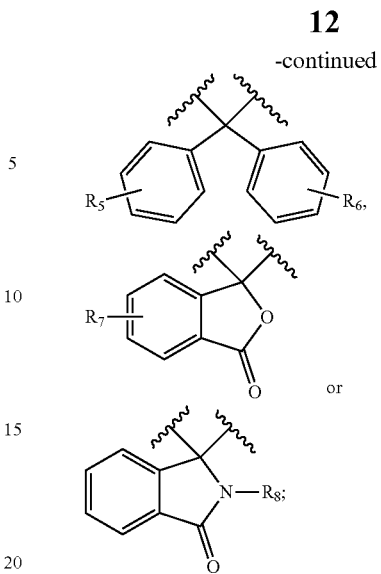

$L^1$ is each independently a $C_{1-10}$ alkylene group, a $C_{3-20}$ cycloalkylene group, or a $C_{1-10}$ alkyleneoxy group; $R_1$ to $R_7$ are each independently H, a $C_{1-10}$ alkyl group, a $C_{1-10}$ alkoxy group, a $C_{2-10}$ alkenyl group, or a $C_{6-14}$ aryl group; $R_8$ is H, methyl, ethyl, $CH_3CH(Cl)-$, $CH_3CH(OH)-$, $CH_2=CHCH_2-$, or phenyl; and n is an integer from 0 to 10.

Particular examples of the $C_{1-10}$ alkylene group may include methylene, ethylene, propylene, isopropylene, butylene, isobutylene, sec-butylene, t-butylene, pentylene, isopentylene, t-pentylene, hexylene, heptylene, octylene, isooctylene, t-octylene, 2-ethylhexylene, nonylene, isononylene, decylene, isodecylene, and the like.

Particular examples of the $C_{3-20}$ cycloalkylene group may include cyclopropylene, cyclobutylene, cyclopentylene, cyclohexylene, cycloheptylene, decalinylene, adamantylene, and the like.

Particular examples of the $C_{1-10}$ alkyleneoxy group may include methyleneoxy, ethyleneoxy, propyleneoxy, butyleneoxy, sec-butyleneoxy, t-butyleneoxy, pentyleneoxy, hexyleneoxy, heptyleneoxy, octyleneoxy, 2-ethyl-hexyleneoxy, and the like.

Particular examples of the $C_{1-10}$ alkyl group may include methyl, ethyl, propyl, isopropyl, butyl, isobutyl, sec-butyl, t-butyl, pentyl, isopentyl, t-pentyl, hexyl, heptyl, octyl, isooctyl, t-octyl, 2-ethylhexyl, nonyl, isononyl, decyl, isodecyl, and the like.

Particular examples of the $C_{1-10}$ alkoxy group may include methoxy, ethoxy, propoxy, butyloxy, sec-butoxy, t-butoxy, pentoxy, hexyloxy, heptoxy, octyloxy, 2-ethyl-hexyloxy, and the like.

Particular examples of the $C_{2-10}$ alkenyl group may include vinyl, allyl, butenyl, propenyl, and the like.

Particular examples of the $C_{6-14}$ aryl group may include phenyl, tolyl, xylyl, naphthyl, and the like.

In a preferred example, the epoxy resin compound having a cardo backbone structure may be prepared through the synthesis route below:

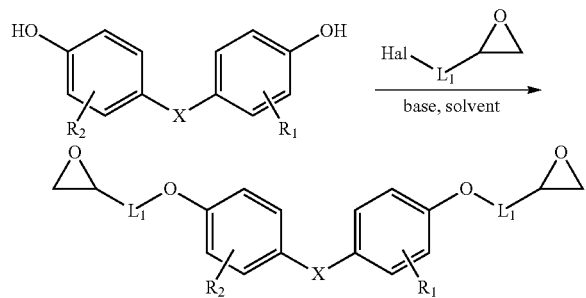

In Reaction Scheme 1, Hal is halogen; and X, $R_1$, $R_2$, and $L_1$ are the same as defined in Formula 1.

reacting the epoxy adduct thus obtained with a polybasic acid anhydride, or by further reacting the product thus obtained with a monofunctional or polyfunctional epoxy compound. Any unsaturated basic acid known in the art, e.g., acrylic acid, methacrylic acid, crotonic acid, cinnamic acid, sorbic acid, and the like, may be used. Any polybasic acid anhydride known in the art, e.g., succinic anhydride, maleic anhydride, trimellitic anhydride, pyromellitic anhydride, 1,2,4,5-cyclohexane tetracarboxylic dianhydride, hexahydrophthalic anhydride, and the like, may be used. Any monofunctional or polyfunctional epoxy compound known in the art, e.g., glycidyl methacrylate, methyl glycidyl ether, ethyl glycidyl ether, propyl glycidyl ether, isopropyl glycidyl ether, butyl glycidyl ether, isobutyl glycidyl ether, bisphenol Z glycidyl ether, and the like, may be used.

In a preferred example, the compound derived from the epoxy resin having a cardo backbone structure may be prepared through the synthesis route of below:

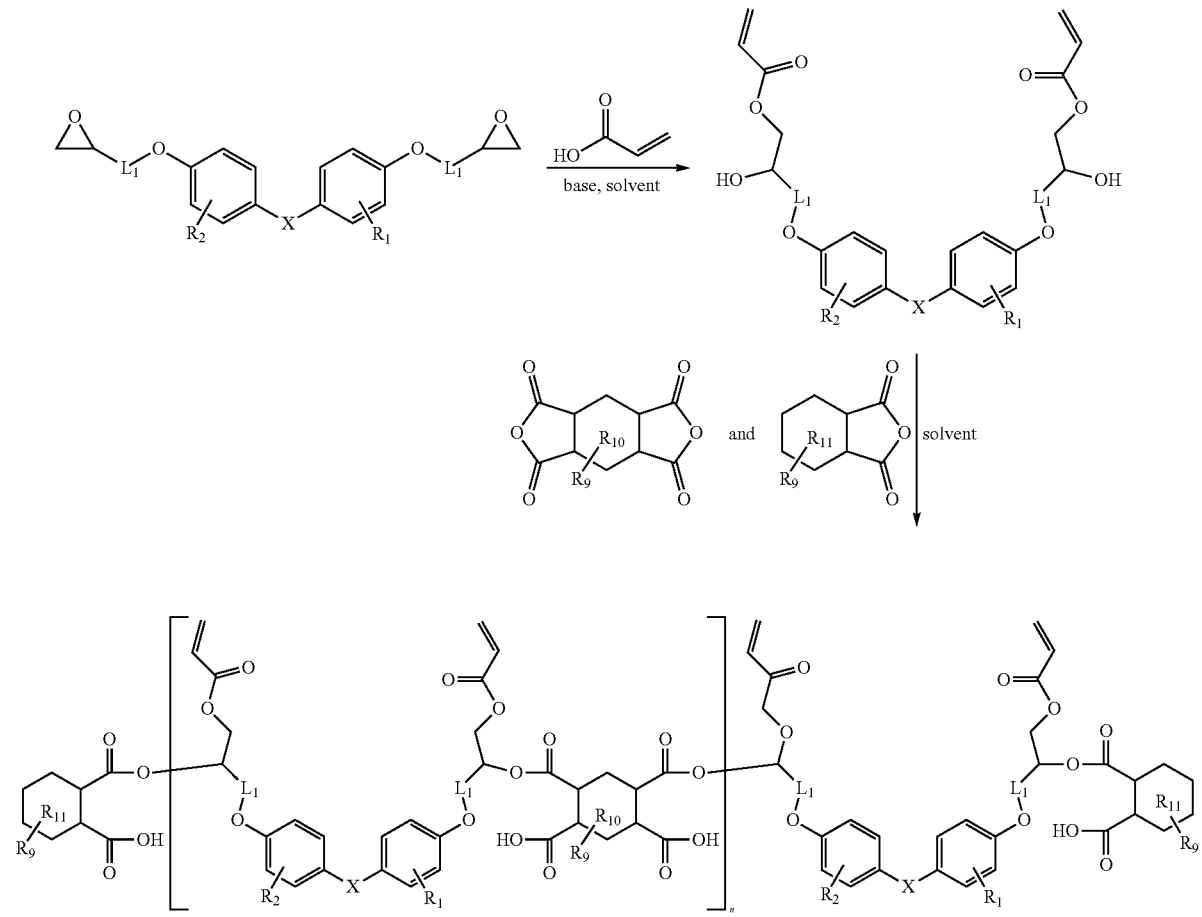

The compound derived from the epoxy resin having a cardo backbone structure may be obtained by reacting the epoxy resin having a cardo backbone structure with an unsaturated basic acid to produce an epoxy adduct and then In Reaction Scheme 2, $R_9$ is each independently H, a $C_{1-10}$ alkyl group, a $C_{1-10}$ alkoxy group, a $C_{2-10}$ alkenyl group, or a $C_{6-14}$ aryl group; $R_{10}$ and $R_{11}$ are each independently a saturated or unsaturated $C_6$ aliphatic ring or a benzene ring;

n is an integer from 1 to 10; and X, $R_1$, $R_2$, and $L_1$ are the same as defined in Formula 1.

In case a compound derived from an epoxy resin compound having a cardo backbone structure is used, the cardo backbone structure may improve adhesiveness of a cured material to a substrate, alkaline resistance, processability, strength, and the like. Further, an image having a fine resolution may be formed in a pattern once an uncured part is removed upon development.

Examples of the novolak resin include, for example, a phenol novolac epoxy compound, a biphenyl novolac epoxy compound, a cresol novolak epoxy compound, a bisphenol A novolak epoxy compound, a dicyclopentadiene novolac epoxy compound, and the like.

The amount of the compound derived from an epoxy resin compound may be 0 to 40 wt %, or 0 to 30 wt %, based on the total amount of the solid content (i.e., the weight excluding solvents) of the colored photosensitive resin composition. Within the range, a pattern profile after development may be favorable, and such properties as chemical resistance and elastic restoring force may be improved.

In the colored photosensitive resin composition of the present invention, the molar ratio of the double bonds in the photopolymerizable compound (B) and in the compound derived from an epoxy resin (E) to the epoxy groups in the copolymer (A) satisfies the following relationship:

4≤number of moles of double bonds/number of moles of epoxy groups≤35.

Specifically, the molar ratio of the double bonds in the photopolymerizable compound (B) and in the compound derived from an epoxy resin (E) to the epoxy groups in the copolymer (A) satisfies the following relationship:

11≤number of moles of double bonds/number of moles of epoxy groups≤35.

(F) Epoxy Compound

The photosensitive resin composition of the present invention may further comprise an epoxy compound so as to increase the internal density of the resin, to thereby improve the chemical resistance of a cured film prepared therefrom.

The epoxy compound may be an unsaturated monomer containing at least one epoxy group, or a homo-oligomer or a hetero-oligomer thereof. Examples of the unsaturated monomer containing at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, or a mixture thereof. Preferably, glycidyl (meth)acrylate may be used.

An example of the commercially available homo-oligomer of an unsaturated monomer containing at least one epoxy group may include GHP03 (glycidyl methacrylate, Miwon Commercial Co., Ltd.).

The epoxy compound may be synthesized by any conventional methods well known in the art.

The epoxy compound (F) may further include the following structural units.

Particular examples may include any structural unit derived from styrene; a styrene having an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; a styrene having a halogen such as fluorostyrene, chlorostyrene, bromostyrene, and iodostyrene; a styrene having an alkoxy substituent such as methoxystyrene, ethoxystyrene, and propoxystyrene; p-hydroxy-α-methylstyrene, acetylstyrene; an ethylenically unsaturated compound having an aromatic ring such as divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth) acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine having an N-vinyl group such as N-vinyl pyrrolidone, N-vinyl carbazole, and N-vinyl morpholine; an unsaturated ether such as vinyl methyl ether, and vinyl ethyl ether; an unsaturated imide such as N-phenylmaleimide, N-(4-chlorophenyl)maleimide, N-(4-hydroxyphenyl)maleimide, and N-cyclohexylmaleimide. The structural unit derived from the above exemplary compounds may be contained in the epoxy compound (F) alone or in combination of two or more thereof.

The epoxy compound (F) may have a weight average molecular weight of 100 to 30,000, or 1,000 to 15,000. If the weight average molecular weight of the epoxy compound is 100 or more, the hardness of a thin film can be more excellent. If the weight average molecular weight of the epoxy compound is 30,000 or less, the thickness of a thin film becomes uniform with a smaller step difference, which is more suitable for planarization. The weight average molecular weight is determined by gel permeation chromatography (eluent: tetrahydrofuran) referenced to polystyrene.

The amount of the epoxy compound may be 0 to 7 wt %, or 1 to 5 wt %, based on the total amount of the solid content (i.e., the weight excluding solvents) of the colored photosensitive resin composition. Within the range, a pattern profile after development may be favorable, and such properties as chemical resistance and elastic restoring force may be improved.

In the colored photosensitive resin composition of the present invention, the molar ratio of the double bonds in the photopolymerizable compound (B) to the epoxy groups in the copolymer (A) and in the epoxy compound (F) may satisfy the following relationship:

4≤number of moles of double bonds/number of moles of epoxy groups≤35.

In the colored photosensitive resin composition of the present invention, the molar ratio of the double bonds in the photopolymerizable compound (B) and in the compound derived from an epoxy resin (E) to the epoxy groups in the copolymer (A) and in the epoxy compound (F) may satisfy the above relationship.

Specifically, the molar ratio of the double bonds in the photopolymerizable compound (B) to the epoxy groups in the copolymer (A) and in the epoxy compound (F) may satisfy the following relationship. Further, the molar ratio of the double bonds in the photopolymerizable compound (B) and in the compound derived from an epoxy resin (E) to the epoxy groups in the copolymer (A) and in the epoxy compound (F) may satisfy the following relationship:

$$11 \leq \text{number of moles of double bonds/number of moles of epoxy groups} \leq 35.$$

(G) Surfactant

The colored photosensitive resin composition of the present invention may further comprise a surfactant to improve coatability and to prevent generation of defects.

Although the kind of the surfactant is not particularly limited, for example, a fluorine-based surfactant or silicon-based surfactant may be used.

The commercially available silicon-based surfactant may include DC3PA, DC7PA, SH11PA, SH21PA, and SH8400 from Dow Corning Toray Silicon, TSF-4440, TSF-4300, TSF-4445, TSF-4446, TSF-4460, and TSF-4452 from GE Toshiba Silicone, BYK-333, BYK-307, BYK-3560, BYK UV-3535, BYK-361N, BYK-354, and BYK-399 from BYK, and the like. The surfactant may be used alone or in combination of two or more.

The commercially available fluorine-based surfactant may include Megaface F-470, F-471, F-475, F-482, F-489, and F-563 from DIC (Dainippon Ink Kagaku Kogyo Co.). Among them, preferable surfactants may be BYK-333 and BYK-307 from BYK and F-563 from DIC in terms of coatability.

The amount of the surfactant may be 0.01 to 3 wt %, or 0.08 to 1 wt %, based on the total weight of the solid content (i.e., the weight excluding solvents) of the colored photosensitive resin composition. Within this range, the colored photosensitive resin composition may be smoothly coated.

(H) Solvent

The colored photosensitive resin composition of the present invention may preferably be prepared as a liquid composition in which the above components and a solvent are mixed. Any solvent known in the art, which is compatible but not reactive with the components in the colored photosensitive resin composition, may be used in the preparation of the colored photosensitive resin composition.

Examples of the solvent may include glycol ethers such as ethylene glycol monoethyl ether; ethylene glycol alkyl ether acetates such as ethyl cellosolve acetate; esters such as ethyl 2-hydroxypropionate; diethylene glycols such as diethylene glycol monomethyl ether; propylene glycol alkyl ether acetates such as propylene glycol monomethyl ether acetate, and propylene glycol propyl ether acetate; and alkoxyalkyl acetates such as 3-methoxybutyl acetate. The solvent may be used alone or in combination of two or more.

The amount of the solvent is not specifically limited, but may be 50 to 90 wt %, or 70 to 85 wt %, based on the total weight of the colored photosensitive resin composition in view of coatability and stability of the colored photosensitive resin composition finally obtained.

In addition, the colored photosensitive resin composition of the present invention may comprise other additives such as an antioxidant and a stabilizer as long as the physical properties of the colored photosensitive resin composition are not adversely affected.

The colored photosensitive resin composition of the present invention as described above can form a cured film having excellent surface smoothness and minimized generation of wrinkles on its surface. Thus, it may be useful for preparing a light shielding spacer such as a black column spacer used for various electronic parts including LCD and OLED display panels.

The colored photosensitive resin composition of the present invention comprising the above-described components may be prepared by a common method, for example, by the following method.

At first, a colorant is mixed with a solvent in advance and dispersed therein using a bead mill until the average particle diameter of the colorant reaches a desired value. At this time, a surfactant may be used, or a portion or the whole of a copolymer may be mixed. Added to the dispersion thus obtained are the remainder of the copolymer and the surfactant, a compound derived from an epoxy resin, a photopolymerizable compound, and a photopolymerization initiator. An additive such as an epoxy compound or an additional solvent, if necessary, is further mixed to a certain concentration, followed by sufficiently stirring them to obtain a desired colored photosensitive resin composition.

The present invention also provides a light shielding spacer manufactured from the colored photosensitive resin composition.

Specifically, there is provided in the present invention a black column spacer (BCS) manufactured using the colored photosensitive resin composition, wherein a column spacer and a black matrix are integrated into one module. An embodiment of the pattern of the black column spacer is illustrated in FIG. 1.

The light shielding spacer may be manufactured by a coating formation step, a light exposure step, a development step, and a heating step.

In the coating formation step, the colored photosensitive resin composition according to the present invention is coated on a pre-treated substrate by a spin coating method, a slit coating method, a roll coating method, a screen printing method, an applicator method, and the like in a desired thickness, for example 1 to 25 μm, and then pre-cured at a temperature of 70 to 100° C. for 1 to 10 minutes and forms a coating by removing the solvent therefrom.

In order to form a pattern on the coated film, a mask having a predetermined shape is placed thereon and irradiated with an activated ray having 200 to 500 nm. At this time, in order to manufacture an integrated-type black column spacer, a mask having patterns with different transmittances may be used to accomplish a column spacer and a black matrix at the same time. As a light source used for the irradiation, a low-pressure mercury lamp, a high-pressure mercury lamp, an extra high-pressure mercury lamp, a metal halide lamp, an argon gas laser, and the like may be used; and X-ray, electronic ray, and the like may also be used, if desired. The amount of light exposure may vary depending on the kind and the compositional ratio of the components of the composition and the thickness of a dried coating. If a high-pressure mercury lamp is used, the amount of light exposure may be 500 mJ/cm$^2$ or less (at a wavelength of 365 nm).

After the light exposure step, a development step using an aqueous alkaline solution such as sodium carbonate, sodium hydroxide, potassium hydroxide, tetramethylammonium hydroxide, etc., as a developing solvent is performed to dissolve and remove unnecessary portions, where only an exposed portion remains to form a pattern. An image pattern obtained by the development is cooled to room temperature and post-baked in a hot air circulation-type drying furnace at a temperature of 180 to 250° C. for 10 to 60 minutes, thereby obtaining a final pattern.

The light shielding spacer thus produced may be used in the manufacture of electronic parts of an LCD, an OLED display, etc., owing to its excellent physical properties. Thus, the present invention provides an electronic part comprising the light shielding spacer.

The LCD, the OLED display, etc., may include any elements known to a person skilled in the art, except for the light shielding spacer according to the present invention. That is, the present invention encompasses any LCD, any OLED display, etc., in which the light shielding spacer of the present invention may be employed.

Mode for the Invention

Hereinafter, the present invention will be described in more detail with reference to the following examples. However, these examples are set forth to illustrate the present invention, and the scope of the present invention is not limited thereto.

EXAMPLE

Preparation Example 1

Preparation of a Copolymer

To a 500 ml, round-bottomed flask equipped with a refluxing condenser and a stirrer, 100 g of a mixture consisting of 51 mole % of N-phenylmaleimide (PMI), 4 mole % of styrene (Sty), 10 mole % of 4-hydroxybutyl acrylate glycidyl ether (4-HBAGE), and 35 mole % of methacrylic acid (MAA), along with 300 g of propylene glycol monomethyl ether acetate (PGMEA) as a solvent and 2 g of 2,2'-azobis(2,4-dimethylvaleronitrile) as a radical polymerization initiator, were charged. The mixture was then heated to 70° C. and stirred for 5 hours to obtain a copolymer solution (A) having a solid content of 31 wt %. The copolymer thus prepared had an acid value of 100 mg KOH/g and a polystyrene-referenced weight average molecular weight (Mw) measured by gel permeation chromatography of 20,000.

Preparation Example 2

Preparation of a Compound Derived from an Epoxy Resin and having a Cardo Backbone Structure

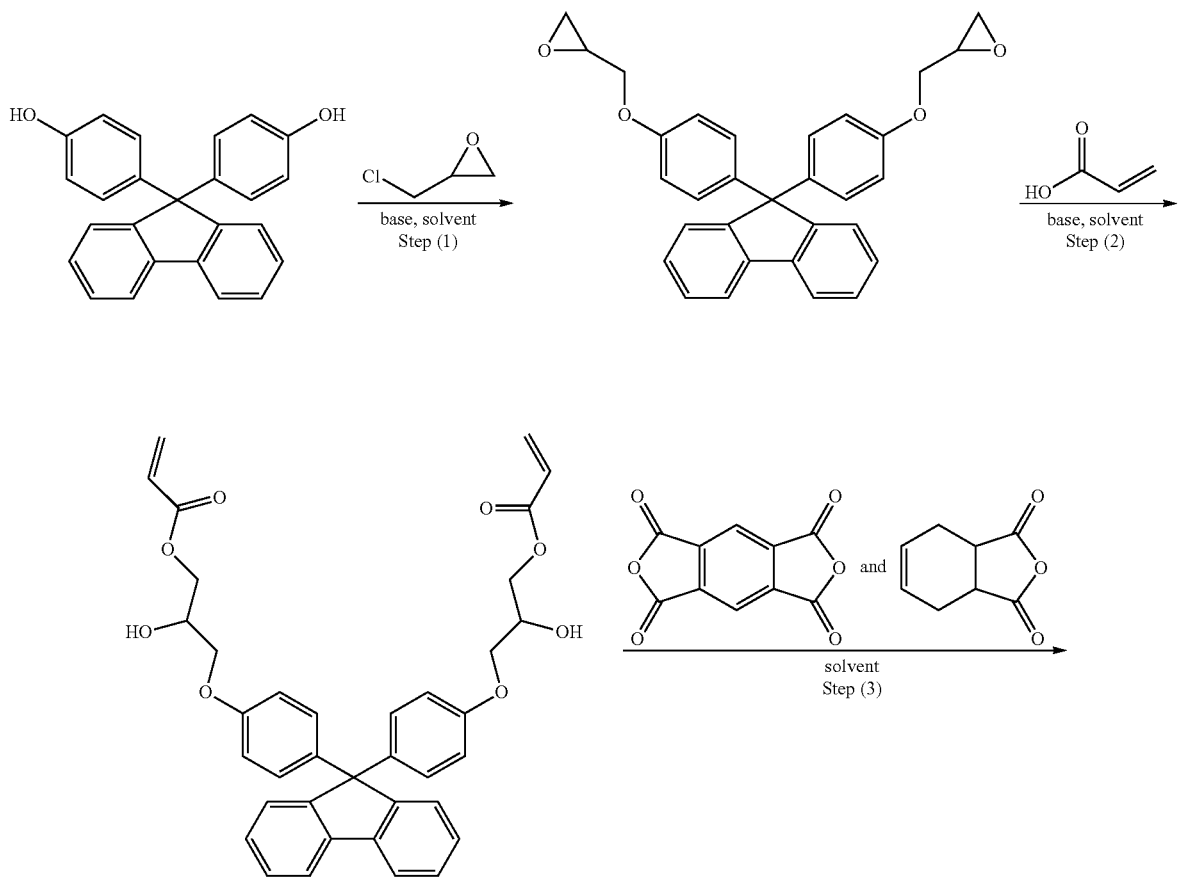

-continued

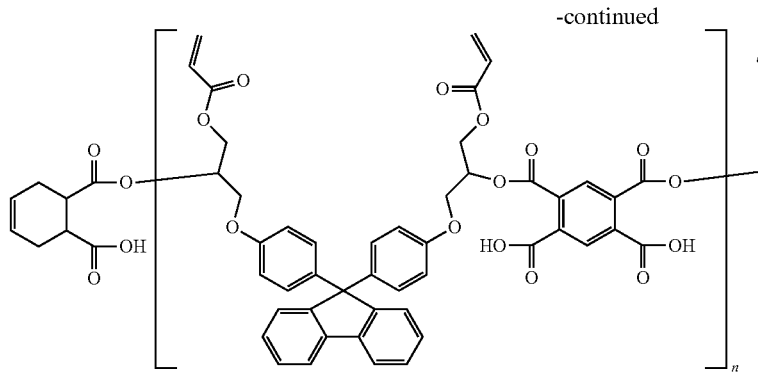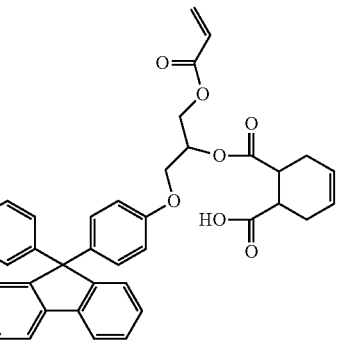

Step (1): Preparation of 9,9-bis[4-(glycidyloxy)phenyl]fluorene

To a 3,000 ml three-neck round-bottom flask, 200 g of toluene, 125.4 g of 4,4'-(9-fluorenylidene)diphenol, and 78.6 g of epichlorohydrin were added, and heated to 40° C. with stirring to obtain a solution. 0.1386 g of t-butylammonium bromide and a 50% NaOH aqueous solution (3 eq.) were mixed in a vessel, and the mixture was slowly added to the resulting solution with stirring.

The reaction mixture thus obtained was heated to 90° C. for 1 hour to remove 4,4'-(9-fluorenylidene)diphenol completely, which was confirmed by HPLC or TLC. The reaction mixture was cooled to 30° C., and 400 ml of dichloromethane and 300 ml of 1 N HCl were added thereto with stirring. Then, the organic layer was separated, washed with 300 ml of distilled water twice or three times, dried over magnesium sulfate, and distilled under a reduced pressure to remove dichloromethane. The resultant was recrystallized using a mixture of dichloromethane and methanol to obtain the title compound, an epoxy resin compound.

Step (2): Preparation of (((9H-fluorene-9,9-diyl)bis (4,1-phenylene))bis(oxy))bis(2-hydroxypropane-3,1-diyl) diacrylate (CAS No. 143182-97-2)

To a 1,000 ml three-neck flask, 115 g of the compound obtained in step (1), 50 mg of tetramethylammonium chloride, 50 mg of 2,6-bis(1,1-dimethylethyl)-4-methylphenol, and 35 g of acrylic acid were added. The mixture was heated to 90-100° C. while blowing air at a flow rate of 25 ml/min and further heated to 120° C. to obtain a solution. The resulting solution was stirred for about 12 hours until its acid value dropped to less than 1.0 mg KOH/g and then cooled to room temperature. 300 ml of dichloromethane and 300 ml of distilled water were added to the reaction mixture with stirring. Then, the organic layer was separated, washed with 300 ml of distilled water twice or three times, dried over magnesium sulfate, and distilled under a reduced pressure to remove dichloromethane, thereby providing the title compound.

Step (3): Preparation of a Compound Derived from an Epoxy Resin and Having a Cardo Backbone Structure The compound obtained in step (2) in PGMEA was placed into a 1,000 ml three-neck flask, and 1,2,4,5-benzenetetracarboxylic acid dianhydride (0.75 eq.), 1,2,3,6-tetrahydrophthalic acid anhydride (0.5 eq.), and triphenylphosphine (0.01 eq.) were further added thereto. The reaction mixture was heated to 120-130° C. for 2 hours with stirring and then cooled to 80-90° C., followed by stirring for 6 hours. After cooling to room temperature, a solution (solid content of 49 wt %) of polymer having a weight average molecular weight (Mw) of 6,000 and an acid value of 107 mg KOH/g (based on the solid content) was obtained.

Preparation Example 3

Preparation of a Colored Dispersion-(1)

A colored dispersion (D-1) was supplied from Tokushiki Co., Ltd., which dispersion had been prepared as follows.

8 g of an acrylic copolymer solution (a copolymer of benzyl methacrylate, styrene, and methacrylic acid) having a weight average molecular weight of 12,000 to 20,000 g/mole and an acid value of 80 to 150 mg KOH/g (Tokushiki Co., Ltd.), 8 g of an acrylic polymer dispersant having an amine value of 100 to 140 mg KOH/g (Tokushiki Co., Ltd.), 12 g of carbon black, 53 g of lactam black (Black 582, BASF) as organic black, 16 g of C.I. Pigment Blue 15:6, and 384 g of PGMEA as a solvent were dispersed using a paint shaker at 25° C. for 6 hours. This dispersing step was performed with 0.3 mm zirconia beads. Upon completion of the dispersing step, the beads were removed from the dispersion using a filter, thereby obtaining a colored dispersion having a solid content of 23 wt %.

Preparation Example 4

Preparation of a Colored Dispersion-(2)

A colored dispersion (D-2) was supplied from Tokushiki Co., Ltd., which dispersion had been prepared in the same manner as in Preparation Example 3, except that only organic black was used as a colorant for the colored dispersion.

Preparation Example 5

Preparation of a Colored Dispersion-(3)

A colored dispersion (D-3) was supplied from Tokushiki Co., Ltd., which dispersion had been prepared in the same manner as in Preparation Example 3, except that only carbon black, which is inorganic black, was used as a colorant for the colored dispersion.

Preparation Example 6

Preparation of a Colored Dispersion-(4)

A colored dispersion (D-4) was supplied from Tokushiki Co., Ltd., which dispersion had been prepared in the same manner as in Preparation Example 3, except that only C.I. Pigment Blue 15:6 was used as a colorant for the colored dispersion.

Preparation Example 7

Preparation of an Epoxy Compound 150 g of glycidyl methacrylate, 2 g of 2,2'-azobisisobutyronitrile, and 450 g of PGMEA were placed in a flask, and the flask was purged with nitrogen for 30 minutes. Thereafter, the flask was immersed in an oil bath with stirring, and polymerization was carried out for 5 hours, while the reaction temperature was maintained at 80° C., thereby obtaining an epoxy compound solution (F) having a solid content of 22 wt % and a weight average molecular weight (Mw) of 12,000.

The compounds prepared in the Preparation Examples above were used to prepare photosensitive resin compositions in the Examples and the Comparative Examples below.

The following additional components were used.

Photopolymerizable compound (B): hexa-functional dipentaerythritol hexaacrylate (DPHA; manufactured by Nippon Kayaku)

Oxime-based photopolymerization initiator (C-1): N-1919 manufactured by ADEKA

Triazine-based photopolymerization initiator (C-2): (E)-2-(4-styrylphenyl)-4,6-bis(trichloromethyl)-1,3,5-triazine (Manufacturer: PHARMASYNTHESE, Brand name: TRIAZINE-Y)

Ketone-based photopolymerization initiator (C-3): 2-dimethylamino-2-(4-methylbenzyl)-1-(4-morpholin-4-ylphenyl)-butanone (Manufacturer: Ciba, Brand name: I-379)

Novolac-based epoxy compound (E-2): CCR-1307H manufactured by Nippon Kayaku

Surfactant (G): BYK-307 manufactured by BYK

Solvent (H): propylene glycol monomethyl ether acetate (PGMEA) manufactured by Chemtronics.

Example 1

Preparation of a Colored Photosensitive Resin Composition 100 parts by weight of the copolymer (A) (solid content of 31 wt %) obtained in Preparation Example 1 as a copolymer, 100 parts by weight of the photopolymerizable compound (B), 4.6 parts by weight of the oxime-based photopolymerization initiator (C-1), 3.8 parts by weight of the triazine-based photopolymerization initiator (C-2), and 4.8 parts by weight of the ketone-based photopolymerization initiator (C-3) as a photopolymerization initiator, 152.1 parts by weight of the colored dispersion (D-1) prepared in Preparation Example 3, 15.3 parts by weight of the epoxy compound solution (F) prepared in Preparation Example 7, and 0.4 part by weight of the surfactant (G) were mixed, followed by addition of the solvent (H) thereto such that the solid content reached 19 wt %. The resultant was mixed using a shaker for 2 hours to prepare a liquid-phase colored photosensitive resin composition.

Examples 2 to 11 and Comparative Examples 1 to 5

Preparation of Colored Photosensitive Resin Compositions

Colored photosensitive resin compositions were prepared in the same manner as in Example 1, except that the amounts of the photopolymerizable compound and of the photopolymerization initiators were changed as described in Table 1 below, that the kinds and amounts of the dispersant (colored dispersion) were changed as described in Table 2 below, and that the kinds and amounts of the compounds derived from an epoxy resin and the amounts of the epoxy compound and of the surfactant were changed as described in Table 3 below (the amounts in Tables 1 to 3 below being in parts by weight based on the solid content).

TABLE 1

| | Photopolymerizable compound (parts by weight) | | Photopolymerization initiator (parts by weight) | | | | | |
|---|---|---|---|---|---|---|---|---|
| Ex. 1 | B | 100 | C-1 | 4.6 | C-2 | 3.8 | C-3 | 4.8 |
| Ex. 2 | B | 100 | C-1 | 4.4 | C-2 | 3.7 | C-3 | 4.6 |
| Ex. 3 | B | 68.5 | C-1 | 3.8 | C-2 | 4 | C-3 | 3.2 |
| Ex. 4 | B | 78 | C-1 | 4 | C-2 | 4.2 | C-3 | 3.4 |
| Ex. 5 | B | 207.6 | C-1 | 10.6 | C-2 | 11 | C-3 | 8.8 |
| Ex. 6 | B | 100 | C-1 | 4.3 | C-2 | 4.4 | C-3 | 3.5 |
| Ex. 7 | B | 100 | C-1 | 4.3 | C-2 | 3.5 | C-3 | 4.4 |
| Ex. 8 | B | 131.8 | C-1 | 6.5 | C-2 | 6.8 | C-3 | 5.4 |
| Ex. 9 | B | 131.8 | C-1 | 6.5 | C-2 | 6.8 | C-3 | 5.4 |
| Ex. 10 | B | 131.8 | C-1 | 7.9 | C-2 | 8.2 | C-3 | 6.6 |
| Ex. 11 | B | 131.8 | C-1 | 6.5 | C-2 | 6.8 | C-3 | 5.4 |
| Ex. 12 | B | 131.8 | C-1 | 6.5 | C-2 | 6.8 | C-3 | 5.4 |
| Ex. 13 | B | 131.8 | C-1 | 6.5 | C-2 | 6.8 | C-3 | 5.4 |
| Ex. 14 | B | 150 | C-1 | 5.3 | C-2 | 4.4 | C-3 | 5.5 |
| Ex. 15 | B | 153.8 | C-1 | 7.9 | C-2 | 8.3 | C-3 | 6.6 |
| Ex. 16 | B | 163.1 | C-1 | 9.3 | C-2 | 9.7 | C-3 | 7.8 |
| Ex. 17 | B | 233.3 | C-1 | 7.1 | C-2 | 5.9 | C-3 | 7.4 |
| C. Ex. 1 | B | 42.9 | C-1 | 3.7 | C-2 | 3.1 | C-3 | 3.8 |
| C. Ex. 2 | B | 100 | C-1 | 5.2 | C-2 | 4.3 | C-3 | 5.4 |
| C. Ex. 3 | B | 100 | C-1 | 5 | C-2 | 4.1 | C-3 | 5.2 |
| C. Ex. 4 | B | 207.8 | C-1 | 10.2 | C-2 | 10.7 | C-3 | 8.5 |
| C. Ex. 5 | B | 219.2 | C-1 | 11.3 | C-2 | 11.8 | C-3 | 9.4 |

TABLE 2

| | Colorant (mill base) (parts by weight) | | | | | | | |
|---|---|---|---|---|---|---|---|---|
| Ex. 1 | D-1 | 152.1 | D-2 | — | D-3 | — | D-4 | — |
| Ex. 2 | D-1 | 146.5 | D-2 | — | D-3 | — | D-4 | — |
| Ex. 3 | D-1 | 127 | D-2 | — | D-3 | — | D-4 | — |
| Ex. 4 | D-1 | 134.1 | D-2 | — | D-3 | — | D-4 | — |
| Ex. 5 | D-1 | 352.9 | D-2 | — | D-3 | — | D-4 | — |
| Ex. 6 | D-1 | 141.7 | D-2 | — | D-3 | — | D-4 | — |
| Ex. 7 | D-1 | 141.3 | D-2 | 328.3 | D-3 | — | D-4 | — |
| Ex. 8 | D-1 | 216.1 | D-2 | — | D-3 | — | D-4 | — |
| Ex. 9 | D-1 | 216.1 | D-2 | — | D-3 | — | D-4 | — |
| Ex. 10 | D-1 | — | D-2 | 33 | D-3 | — | D-4 | — |
| Ex. 11 | D-1 | — | D-2 | — | D-3 | 216.1 | D-4 | — |
| Ex. 12 | D-1 | — | D-2 | 178.2 | D-3 | 37.9 | D-4 | — |
| Ex. 13 | D-1 | — | D-2 | — | D-3 | 108.1 | D-4 | 108.1 |
| Ex. 14 | D-1 | 176.6 | D-2 | — | D-3 | — | D-4 | — |
| Ex. 15 | D-1 | 264.5 | D-2 | — | D-3 | — | D-4 | — |
| Ex. 16 | D-1 | 310.6 | D-2 | — | D-3 | — | D-4 | — |
| Ex. 17 | D-1 | 235.5 | D-2 | — | D-3 | — | D-4 | — |
| C. Ex. 1 | D-1 | 122.6 | D-2 | — | D-3 | — | D-4 | — |
| C. Ex. 2 | D-1 | 171.7 | D-2 | — | D-3 | — | D-4 | — |
| C. Ex. 3 | D-1 | 167.5 | D-2 | — | D-3 | — | D-4 | — |
| C. Ex. 4 | D-1 | 340.8 | D-2 | — | D-3 | — | D-4 | — |
| C. Ex. 5 | D-1 | 376.9 | D-2 | — | D-3 | — | D-4 | — |

TABLE 3

| | Compound derived from an epoxy (parts by weight) | | | | Epoxy compound (parts by weight) | | Surfactant (parts by weight) | |
|---|---|---|---|---|---|---|---|---|
| Ex. 1 | E-1 | — | E-2 | — | F | 15.3 | G | 0.4 |
| Ex. 2 | E-1 | — | E-2 | — | F | 7.3 | G | 0.4 |
| Ex. 3 | E-1 | 10.8 | E-2 | — | F | — | G | 0.3 |
| Ex. 4 | E-1 | 11.4 | E-2 | — | F | — | G | 0.3 |
| Ex. 5 | E-1 | 172.9 | E-2 | — | F | 17.6 | G | 0.9 |
| Ex. 6 | E-1 | — | E-2 | — | F | — | G | 0.4 |
| Ex. 7 | E-1 | — | E-2 | — | F | — | G | 0.4 |
| Ex. 8 | E-1 | 73.2 | E-2 | — | F | — | G | 0.5 |
| Ex. 9 | E-1 | — | E-2 | 73.2 | F | — | G | 0.5 |
| Ex. 10 | E-1 | 73.2 | E-2 | — | F | — | G | 0.7 |
| Ex. 11 | E-1 | 73.2 | E-2 | — | F | — | G | 0.5 |
| Ex. 12 | E-1 | 73.2 | E-2 | — | F | — | G | 0.5 |
| Ex. 13 | E-1 | 73.2 | E-2 | — | F | — | G | 0.5 |
| Ex. 14 | E-1 | — | E-2 | — | F | — | G | 0.4 |
| Ex. 15 | E-1 | 119.5 | E-2 | — | F | — | G | 0.7 |
| Ex. 16 | E-1 | 175.3 | E-2 | — | F | — | G | 0.8 |
| Ex. 17 | E-1 | — | E-2 | — | F | — | G | 0.6 |
| C. Ex. 1 | E-1 | — | E-2 | — | F | 30.8 | G | 0.3 |
| C. Ex. 2 | E-1 | — | E-2 | — | F | 43.1 | G | 0.4 |
| C. Ex. 3 | E-1 | — | E-2 | — | F | 33 | G | 0.4 |
| C. Ex. 4 | E-1 | 173.1 | E-2 | — | F | — | G | 0.9 |
| C. Ex. 5 | E-1 | 212.7 | E-2 | — | F | — | G | 0.9 |

Test Example 1

Preparation of a Cured Film from a Colored Photosensitive Resin Composition

The colored photosensitive resin compositions obtained in the Examples and in Comparative Examples each were coated on a glass substrate using a spin coater and pre-baked at 95° C. for 150 seconds to form a coated film in a thickness of 4.8 µm. A mask was disposed on the coated film thus formed such that an area of 5 cm by 5 cm of the coated film was 100% exposed to light and that the gap with the substrate was maintained at 50 µm. Thereafter, the coated film was irradiated with light at an exposure rate of 66 mJ/cm$^2$ based on a wavelength of 365 nm for a certain time period using an aligner (model name: MA6), which emits light having a wavelength of 200 nm to 450 nm. It was then developed with a 0.04 wt % aqueous solution of potassium hydroxide at 23° C. until the unexposed portion was completely washed out. The pattern thus formed was post-baked in an oven at 230° C. for 30 minutes to obtain a cured film (light shielding spacer) in a thickness of 4.0 µm (±0.1 µm).

1-1: Measurement of Changes in Development Time with Respect to Pre-Bake Temperature The pre-bake temperature was changed to 80° C. and 100° C. during the above process for the preparation of a cured film, and evaluation was carried out under the same conditions as above. Then, the time for which the unexposed portion was completely washed out (until the stage O-ring part of the development apparatus was completely seen behind the substrate) with a 0.04 wt % aqueous solution of potassium hydroxide at 23° C. was measured. Further, the changes in development time with respect to the changes in pre-bake temperature was converted and recorded.

1-2: Measurement of Surface Characteristics

The surface of the cured film thus obtained was measured by recording the vibration value of the vertical motion of the equipment probe tip using SCAN PLUS, which is an α-step equipment (Alpha-step profilometer), and the surface of the cured film was photographed with an optical microscope (STM6, Olympus) in a magnification of 20 times.

1-3: Measurement of Optical Density

A cured film having a thickness of 3.0 µm after post-bake was obtained in the above process for the preparation of a cured film, except that a mask was not employed. The transmittance at 550 nm of the cured film was measured using an optical density meter (361T, manufactured by Xlite), and the optical density based on a thickness of 1 µm was determined.

The results obtained in the above Test Examples are summarized in Table 4 below, the changes in development time with respect to the number of moles of double bonds/number of moles of epoxy groups are illustrated in FIG. 2, and the photographs of the surfaces of the cured films are shown in FIGS. 3 to 7.

TABLE 4

| | | Changes in development time with respect to changes in pre-bake temp. (sec/° C.) | Colored photosensitive resin composition | | |
|---|---|---|---|---|---|
| | Surface wrinkles (α-step_ΔH) (Å) | | Optical density (OD) (/1 µm) | Double bonds (mole) | Epoxy groups (mole) | No. of moles of double bonds/No. of moles of epoxy groups |
| Ex. 1 | 1,379 | 3.95 | 1.11 | 0.0151 | 0.00252 | 5.992 |
| Ex. 2 | 1,377 | 1.7 | 1.11 | 0.0156 | 0.00182 | 8.571 |
| Ex. 3 | 1,376 | — | 1.11 | 0.0129 | 0.00126 | 10.254 |
| Ex. 4 | 1,312 | — | 1.11 | 0.0138 | 0.00119 | 11.587 |
| Ex. 5 | 1,860 | — | 1.11 | 0.0162 | 0.00119 | 13.591 |
| Ex. 6 | 1,454 | — | 1.12 | 0.0162 | 0.00113 | 14.336 |
| Ex. 7 | 1,426 | 0.7 | 1.12 | 0.0162 | 0.00112 | 14.464 |
| Ex. 8 | 1,421 | — | 1.10 | 0.0159 | 0.00074 | 21.486 |
| Ex. 9 | 1,791 | — | 1.12 | 0.0159 | 0.00074 | 21.486 |
| Ex. 10 | 1,367 | — | 1.45 | 0.0131 | 0.00061 | 21.475 |
| Ex. 11 | 1,323 | — | 2.02 | 0.0159 | 0.00074 | 21.486 |
| Ex. 12 | 1,929 | — | 1.32 | 0.0159 | 0.00074 | 21.486 |
| Ex. 13 | 1,861 | — | 1.02 | 0.0159 | 0.00074 | 21.486 |
| Ex. 14 | 1,634 | 0.25 | 1.11 | 0.0195 | 0.0009 | 21.667 |
| Ex. 15 | 1,460 | — | 1.12 | 0.01586 | 0.0006 | 26.258 |
| Ex. 16 | 1,520 | — | 1.11 | 0.01518 | 0.00052 | 29.482 |
| Ex. 17 | 1,642 | 0.2 | 1.10 | 0.0227 | 0.00067 | 33.881 |
| C. Ex. 1 | Unmeasurable | Not developed | 1.09 | 0.008 | 0.00499 | 1.603 |
| C. Ex. 2 | Unmeasurable | 100° C., not developed | 1.10 | 0.0133 | 0.00462 | 2.879 |

TABLE 4-continued

| | Changes in development | | Colored photosensitive resin composition | | | |
|---|---|---|---|---|---|---|
| | Surface wrinkles (α-step_ΔH) (Å) | time with respect to changes in pre-bake temp. (sec/° C.) | Optical density (OD) (/1 μm) | Double bonds (mole) | Epoxy groups (mole) | No. of moles of double bonds/No. of moles of epoxy groups |
| C. Ex. 3 | 1,371 | 7.95 | 1.12 | 0.0139 | 0.00392 | 3.546 |
| C. Ex. 4 | 13,241 | — | 0.74 | 0.0168 | 0.00047 | 35.821 |
| C. Ex. 5 | 13,762 | — | 0.67 | 0.01648 | 0.00042 | 38.875 |

As shown in Table 4 and FIGS. 3 to 9, the compositions of the Examples, which fall within the scope of the present invention, not only provided cured films with minimized uneven wrinkles on their surfaces, but also enabled development in a short period of time. In contrast, the compositions according to the Comparative Examples, which do not fall within the scope of the present invention, showed at least one unfavorable result.

REFERENCE NUMERALS OF THE DRAWINGS

A: thickness of the column spacer part
B: thickness of the black mattress part
C: Critical dimension (CD) of the column spacer part

The invention claimed is:

1. A colored photosensitive resin composition, which comprises:
    (A) a copolymer comprising an epoxy group;
    (B) a photopolymerizable compound comprising a double bond;
    (C) a photopolymerization initiator; and
    (D) a colorant,
    wherein the molar ratio of the double bonds in the photopolymerizable compound (B) to the epoxy groups in the copolymer (A) satisfies the following relationship:

4≤number of moles of double bonds/number of moles of epoxy groups≤35; and wherein a cured film formed from the colored photosensitive resin composition has an optical density of 1.0/μm to 3.0/μm.

2. The colored photosensitive resin composition according to claim 1, wherein the colorant comprises a dispersion resin, and the dispersion resin has an amine value of 3 mg KOH/g or less and comprises 30 mole % or less of a maleimide monomer based on the total number of moles of the constituents.

3. The colored photosensitive resin composition according to claim 1, which further comprises (E) a compound derived from an epoxy resin and having a double bone.

4. The colored photosensitive resin composition according to claim 3, wherein the molar ratio of the double bonds in the photopolymerizable compound (B) and in the compound derived from an epoxy resin (E) to the epoxy groups in the copolymer (A) satisfies the following relationship:

4≤number of moles of double bonds/number of moles of epoxy groups≤35.

5. The colored photosensitive resin composition according to claim 3, which further comprises (F) an epoxy compound.

6. The colored photosensitive resin composition according to claim 5, wherein the molar ratio of the double bonds in the photopolymerizable compound (B) and in the compound derived from an epoxy resin (E) to the epoxy groups in the copolymer (A) and in the epoxy compound (F) satisfies the above relationship:

4≤number of moles of double bonds/number of moles of epoxy groups≤35.

7. The colored photosensitive resin composition according to claim 1, which further comprises (F) an epoxy compound.

8. The colored photosensitive resin composition according to claim 7, wherein the molar ratio of the double bonds in the photopolymerizable compound (B) to the epoxy groups in the copolymer (A) and in the epoxy compound (F) satisfies the following relationship:

4≤number of moles of double bonds/number of moles of epoxy groups≤35.

9. A light shielding spacer manufactured from the colored photosensitive resin composition according to claim 1.

* * * * *